US011017874B2

(12) United States Patent
Saillet et al.

(10) Patent No.: US 11,017,874 B2
(45) Date of Patent: May 25, 2021

(54) DATA AND MEMORY REORGANIZATION

(71) Applicant: INTERNATIONAL BUSINESS MACHINES CORPORATION, Armonk, NY (US)

(72) Inventors: Yannick Saillet, Stuttgart (DE); Namit Kabra, Hyderabad (IN); Likhitha Maddirala, Hyderabad (IN); Ritesh Kumar Gupta, Hyderaba (IN)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 16/402,334

(22) Filed: May 3, 2019

(65) Prior Publication Data

US 2020/0350032 A1 Nov. 5, 2020

(51) Int. Cl.
*G11C 29/18* (2006.01)
*G11C 29/38* (2006.01)
*G11C 29/44* (2006.01)
*G06F 3/06* (2006.01)

(52) U.S. Cl.
CPC ............ *G11C 29/38* (2013.01); *G06F 3/0619* (2013.01); *G06F 3/0644* (2013.01); *G06F 3/0659* (2013.01); *G06F 3/0673* (2013.01); *G11C 29/44* (2013.01)

(58) Field of Classification Search
CPC ......... G11C 29/38; G11C 29/44; G11C 29/52; G11C 29/24; G11C 29/18; G11C 29/54; G06F 3/0659; G06F 3/0644; G06F 3/0619; G06F 3/0673
USPC ........................................................ 714/718
See application file for complete search history.

(56) References Cited

U.S. PATENT DOCUMENTS

| 7,310,752 | B2 * | 12/2007 | Jeddeloh ............ G06F 11/2221 714/718 |
| 10,558,809 | B1 * | 2/2020 | Joyce .................... G06F 21/577 |
| 2003/0046029 | A1 * | 3/2003 | Wiener ............... G06F 11/3672 702/186 |
| 2009/0037690 | A1 * | 2/2009 | Busck .................... G06F 8/434 711/221 |
| 2015/0058280 | A1 | 2/2015 | Nelke |
| 2015/0279485 | A1 * | 10/2015 | Weksler ................ G11C 29/18 714/720 |
| 2017/0147693 | A1 | 5/2017 | Bhagwan |
| 2018/0063179 | A1 * | 3/2018 | Salajegheh .......... G06F 21/564 |
| 2018/0157442 | A1 * | 6/2018 | Vorobyov ............ G06F 3/0604 |

(Continued)

FOREIGN PATENT DOCUMENTS

WO 2015136395 A1 9/2015

*Primary Examiner* — Albert Decady
*Assistant Examiner* — Enam Ahmed
(74) *Attorney, Agent, or Firm* — Schmeiser, Olsen & Watts; Stephanie Carusillo

(57) ABSTRACT

A method and system for improving data and memory reorganization and storage technology is provided. The method includes configuring data capture and analysis settings of a database system resulting in configured data capture settings. A data and associated memory analysis request is received and specified test code is selected. A specified portion of data and associated memory is selected and the specified analysis code is executed resulting in execution of said specified type of analysis with respect to the specified portion of said data and associated memory. The specified portion of said data and associated memory is modified and stored.

20 Claims, 7 Drawing Sheets

(56) References Cited

U.S. PATENT DOCUMENTS

| | | |
|---|---|---|
| 2018/0276263 A1 | 9/2018 | Voigt |
| 2018/0349445 A1 | 12/2018 | Ramos |
| 2019/0005430 A1 | 1/2019 | Boyacigiller |

* cited by examiner

DATA AND MEMORY REORGANIZATION

FIELD

The present invention relates generally to a method for organizing computer storage and in particular to a method and associated system for improving memory storage technology associated with selecting and executing specialized computer code for modifying data and memory storage within a modified portion of memory.

BACKGROUND

Typical data tool systems allow for little flexibility with respect validation issues. Automatic analysis code may implement a complicated process that may be time consuming and require a large amount of resources. Additionally, detecting code for efficient software execution may require technically advanced equipment for enabling automated functionality.

SUMMARY

A first aspect of the invention provides a data and memory reorganization and storage method comprising: configuring, by a processor of a database hardware controller, data capture and analysis settings of a database system resulting in configured data capture and analysis settings; receiving from a remotely located data source, by the processor in accordance with the configured data capture settings, a data and associated memory analysis request; selecting, by the processor in response to the receiving the data and associated memory analysis request, specified test code for executing a specified type of analysis with respect to data being stored within a specialized memory structure; selecting, by the processor, a specified portion of the data and a specified portion of the memory; executing, by the processor, the specified test code resulting in execution of the a specified type of analysis with respect to the specified portion of the data and the specified portion of the memory; modifying, by the processor in response to executing the specified test code, the specified portion of the data and the specified portion of the memory resulting in a modified portion of the data and a modified portion of the memory; and storing, by the processor, the modified portion of the data within the modified portion of the memory.

A second aspect of the invention provides a computer program product, comprising a computer readable hardware storage device storing a computer readable program code, the computer readable program code comprising an algorithm that when executed by a processor of a database hardware controller implements a data and memory reorganization and storage method, the method comprising: configuring, by the processor, data capture and analysis settings of a database system resulting in configured data capture and analysis settings; receiving from a remotely located data source, by the processor in accordance with the configured data capture settings, a data and associated memory analysis request; selecting, by the processor in response to the receiving the data and associated memory analysis request, specified test code for executing a specified type of analysis with respect to data being stored within a specialized memory structure; selecting, by the processor, a specified portion of the data and a specified portion of the memory; executing, by the processor, the specified test code resulting in execution of the a specified type of analysis with respect to the specified portion of the data and the specified portion of the memory; modifying, by the processor in response to executing the specified test code, the specified portion of the data and the specified portion of the memory resulting in a modified portion of the data and a modified portion of the memory; and storing, by the processor, the modified portion of the data within the modified portion of the memory.

A third aspect of the invention provides a database hardware controller comprising a processor coupled to a computer-readable memory unit, the memory unit comprising instructions that when executed by the computer processor implements a data and memory reorganization and storage method comprising: configuring, by the processor, data capture and analysis settings of a database system resulting in configured data capture and analysis settings; receiving from a remotely located data source, by the processor in accordance with the configured data capture settings, a data and associated memory analysis request; selecting, by the processor in response to the receiving the data and associated memory analysis request, specified test code for executing a specified type of analysis with respect to data being stored within a specialized memory structure; selecting, by the processor, a specified portion of the data and a specified portion of the memory; executing, by the processor, the specified test code resulting in execution of the a specified type of analysis with respect to the specified portion of the data and the specified portion of the memory; modifying, by the processor in response to executing the specified test code, the specified portion of the data and the specified portion of the memory resulting in a modified portion of the data and a modified portion of the memory; and storing, by the processor, the modified portion of the data within the modified portion of the memory.

The present invention advantageously provides a simple method and associated system capable of detecting code for efficient software execution.

DETAILED DESCRIPTION

Figure 1:
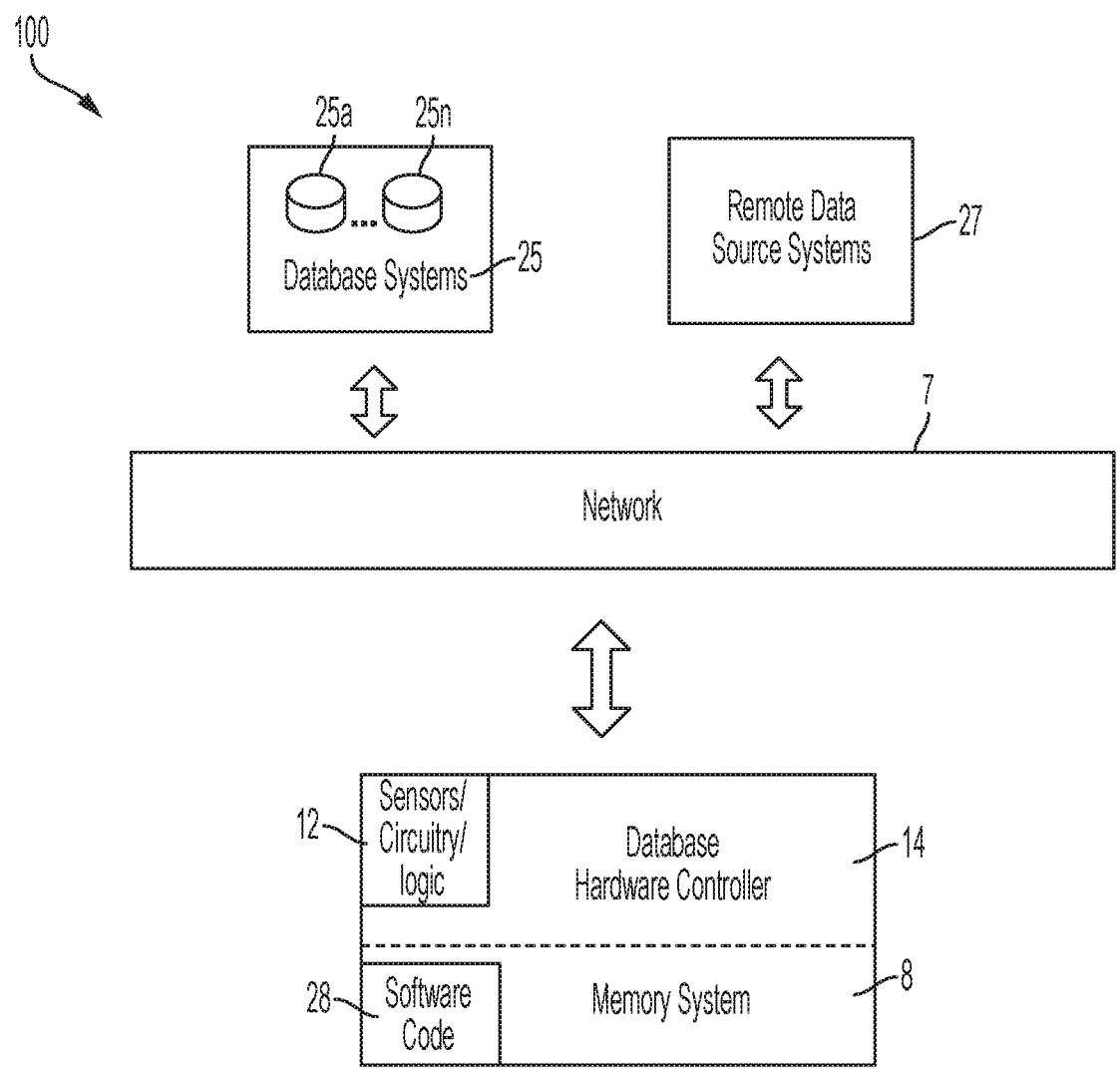
FIG. 1 illustrates a system for improving memory storage technology associated with selecting and executing specialized computer code for modifying data and memory storage within a modified portion of memory, in accordance with embodiments of the present invention.

FIG. 1 illustrates a system 100 for improving memory storage technology associated with selecting and executing specialized computer code for modifying data and memory storage within a modified portion of memory, in accordance with embodiments of the present invention. Typical data repositories execute information analysis processes triggered as data is received and accessed. Based on an initial analysis execution, an analyst determines appropriate data for use. Determining appropriate data for use may include analyzing multiple data sets requiring a time consuming process. Currently, data sets are ingested and analyzed in an order of ingestion, thereby causing a resource shortage during simultaneous ingestion processes. Data analysis processes do not typically discriminate among data set ingestion processes and likewise dose not learn from past ingestion runs thereby causing a delay with respect to running analysis processes with respect to important datasets. The aforementioned problem is exacerbated if a new rule is applied to a dataset thereby causing several datasets to become invalid and requiring further runs. Likewise, data analysis tools are used for access to issues with a structure or validity of associated data. Typical data analysis tools are configured scan full volumes of data to determine an associated quality and structure of the data such that with every fresh scan, an associated analysis is run again with respect to the entire data even though no records were modified during a last run of the analysis. Likewise, analysis processes for a specified data column may include extended analysis times lasting multiple hours. Therefore, an intelligent software/hardware (e.g., of system 100) engine may be enabled to efficiently run a data analysis process by determining algorithms to be avoided to increase a speed of analysis.

System 100 is enabled to execute a process for enabling a data analysis process with respect to on board data such that a data analysis tool may be configured to dynamically prioritize the data analysis process based on term ranking and machine learning. A limitation of current data analysis tools is associated with an inability of usage of information governance to determine critical data such that scan cycles with respect to data are run unnecessarily without consequence. Additionally, current data analysis tools are not configured to self-learn from past runs. Therefore, system 100 is configured to quickly determine an analysis result associated with a dataset being modified based on various factors.

System 100 is configured for ingesting a data set and assigning a first lightweight based detected metadata and/or via analysis of a first N rows of a data structure for quickly indicating a domain and/or classification of the data structure. Subsequently, process for ranking an importance of a data set (of the data structure) based on data term assignments and self-learning processes associated with previous ranking runs. A higher ranking attribute is associated with a higher criticality of the data set. System 100 enables the following process for ranking an importance of a data set:

The ranking process is initiated when specified data terms are mark as high importance. Alternatively, the ranking process may be initiated via determining data usage attributes of the data set. Likewise, a dataset associated with a high quality threshold (e.g., financial data) is assigned a preference over a dataset associated with a low quality threshold (e.g., social media data). A ranking process may further include a process for counting a number of policies, rules, and reports linked to the specified data terms. Furthermore, a ranking process may include a machine learning process associated with analyzing a number of times a data set is accessed with respect to a function of the terms assigned to it for recording a number of data access attempts for each data set. Subsequently, a predictive model is generated. The predictive model is configured for predicting a number of data access attempts with respect to a function of the data terms associated with the data set. For each new ingested data set, a trained model is executed for predicting a number of data access tries with respect to a ranking. The determined ranking is executed to control an order at which data sets are deep analyzed.

System 100 of FIG. 1 includes a database hardware controller 14, database systems 25, and remote data source systems 27 interconnected through a network 7. Database hardware controller 14 comprises sensors/circuitry/logic 12 and a (specialized) memory system 8. Memory system 8 comprises software code 28 including executable code. Memory system 8 may include a single memory system. Alternatively, memory system 8 may include a plurality of memory systems. Database hardware controller 14, database systems 25, and remote data source systems 27 each may comprise an embedded device(s). An embedded device is defined herein as a dedicated device or computer comprising a combination of computer hardware and software (fixed in capability or programmable) specifically designed for executing a specialized function. Programmable embedded computers or devices may comprise specialized programming interfaces. In one embodiment, database hardware controller 14, database systems 25, and remote data source systems 27 may each comprise a specialized hardware device comprising specialized (non-generic) hardware and circuitry (i.e., specialized discrete non-generic analog, digital, and logic-based circuitry) for (independently or in combination) executing a process described with respect to FIGS. 1-7. The specialized discrete non-generic analog, digital, and logic-based circuitry (e.g., sensors/circuitry/logic 12, etc.) may include proprietary specially designed components (e.g., a specialized integrated circuit, such as for example an Application Specific Integrated Circuit (ASIC) designed for only implementing an automated process for improving memory storage technology associated with selecting and executing specialized computer code for modifying data and memory storage within a modified portion of memory. Sensors/circuitry/logic 12 may include any type of internal or external sensors including, inter alia, GPS sensors, Bluetooth beaconing sensors, cellular telephone detection sensors, Wi-Fi positioning detection sensors, triangulation detection sensors, activity tracking sensors, a temperature sensor, an ultrasonic sensor, an optical sensor, a video retrieval device, humidity sensors, voltage sensors, network traffic sensors, etc. Network 7 may include any type of network including, inter alia, a local area network, (LAN), a wide area network (WAN), the Internet, a wireless network, etc.

System is configured for executing a data analysis process with respect to data assets within a data repository. The data analysis process comprises a software/hardware tool for dynamically prioritizing the data analysis process based on a term ranking, machine learning, and information governance process. System 100 enables the following process for improving memory storage technology associated with selecting and executing specialized computer code for modifying data and memory storage within a modified portion of memory:

1. Receiving an analysis request to perform a specified type of analysis with respect to data assets.
2. Applying hardware/software tests (with respect the data assets) for selecting a data asset for executing the specified type of analysis and selecting a type of analysis to execute the request.
3. Applying hardware/software tests (with respect the data assets) to determine a relevance of the data assets for defining an order of the specified type of analysis based on a relevance of the data assets for analyzing the most relevant data assets first.
4. Executing the test to check if the data assets have changed since the last analysis on the said data asset.
5. Checking a domain or an annotation associated with the data assets for determining a relevance of a result of the request.
6. Modifying the specified type of analysis based on an associated relevance such that one or more steps are omitted to generate an efficient analysis process.

Figure 2:
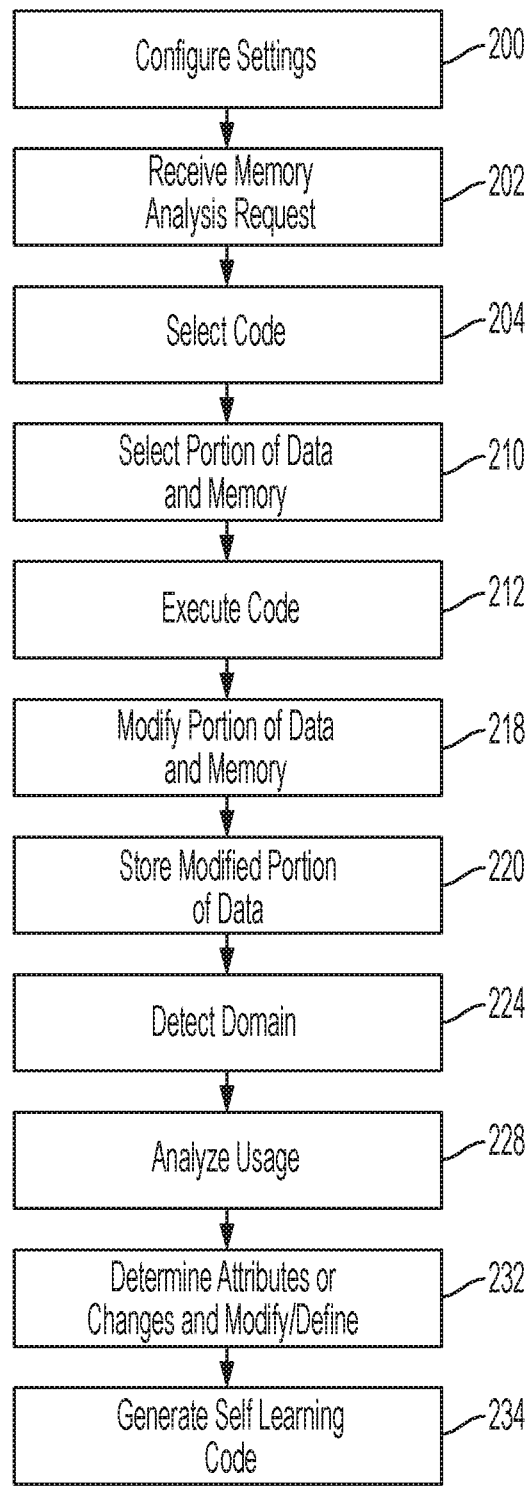
FIG. 2 illustrates an algorithm detailing a process flow enabled by the system of FIG. 1 for improving memory storage technology associated with selecting and executing specialized computer code for modifying data and memory storage within a modified portion of memory, in accordance with embodiments of the present invention.

FIG. 2 illustrates an algorithm detailing a process flow enabled by system 100 of FIG. 1 for improving memory storage technology associated with selecting and executing specialized computer code for modifying data and memory storage within a modified portion of memory, in accordance with embodiments of the present invention. Each of the steps in the algorithm of FIG. 2 may be enabled and executed in any order by a computer processor(s) executing computer code. Additionally, each of the steps in the algorithm of FIG. 2 may be enabled and executed in combination by database hardware controller 14, database systems 25, and remote data source systems 27. In step 200, data capture and analysis settings of a database system are configured resulting in configured data capture and analysis settings. Configuring the data capture and analysis settings may include defining specified hardware and software sources for executing specified analysis code.

In step 202, a data and associated memory analysis request is received from a remotely located data source in accordance with the configured data capture settings. In step 204, specified test code is selected in response to receiving the data and associated memory analysis request. The specified test code is for executing a specified type of analysis with respect to data being stored within a specialized memory structure. In step 210, a specified portion of the data and a specified portion of the memory is selected. In step 212, the specified code is executed resulting in execution of the specified type of analysis with respect to the specified portion of said data and the specified portion of memory. In step 218, the specified portion of data and the specified portion of memory is modified in response to step 212 resulting in a modified portion of data and a modified portion of memory. In step 220, the modified portion of data is stored within the modified portion of memory.

In step 224, a domain is detected in response to executing the specified test code. The domain is associated with the specified portion of data and the specified portion of memory with respect to relevance attributes of the data and associated memory analysis request. In step 228, usage associated with a relevance of the specified portion of data and the specified portion of memory is analyzed. In step 232, relevance attributes associated with the specified portion of data and the specified portion of memory are determined and an order for executing the specified type of analysis is defined based on the relevance attributes. Alternatively (in step 232), changes associated with the specified portion of data and the specified portion of memory are determined with respect to previous analysis processes of the specified portion of data and the specified portion of memory. Additionally, the specified type of analysis is modified in response to the changes. The modification process may include: removing portions of code associated with steps of the specified type of analysis based on the relevance attributes. Likewise, the modified type of analysis is executed to generate a desired result with respect to the specified portion of data and the specified portion of memory.

In step 234, self-learning software code is generated based on execution of the previous steps of the algorithm. The self-learning code is for executing future processes associated with executing the data and memory reorganization and storage method.

Figure 3:
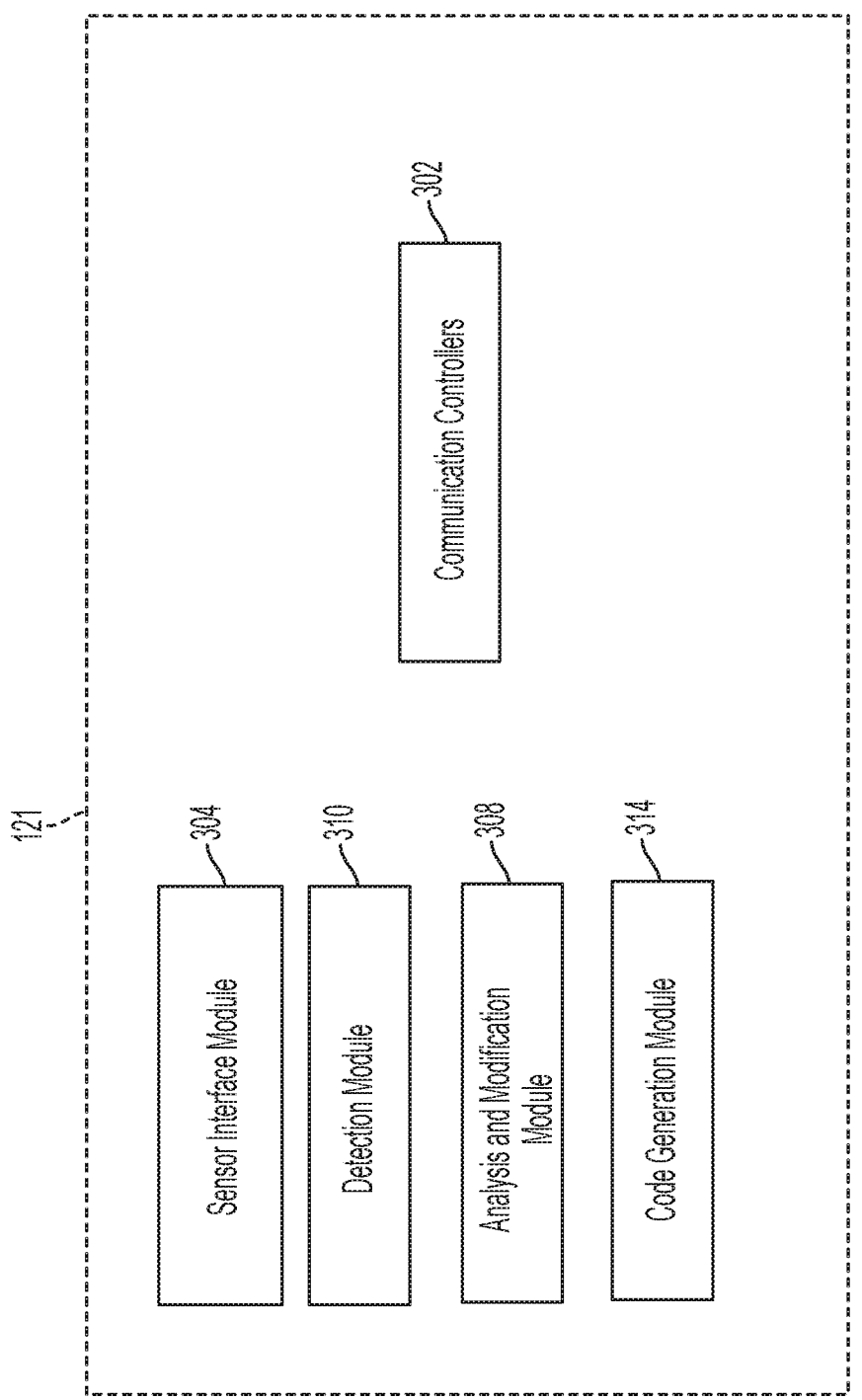
FIG. 3 illustrates an internal structural view of the self-learning software/hardware structure of FIG. 1, in accordance with embodiments of the present invention.

FIG. 3 illustrates an internal structural view of self-learning software/hardware structure 121 and/or self-learning software code/hardware structure 121a of FIG. 1, in accordance with embodiments of the present invention. Self-learning software/hardware structure 121 includes a sensor interface module 304, a detection module 310, an analysis and modification module 308, a code generation module 314, and communication controllers 302. Sensor interface module 304 comprises specialized hardware and software for controlling all functions related to sensors/circuitry/logic 12 of FIG. 1. Detection module 310 comprises specialized hardware and software for controlling all functionality related to implementing the process described with respect to the algorithm of FIG. 2. Analysis and modification module 308 comprises specialized hardware and software for controlling all functions related to the analysis and modification steps of FIG. 2. Code generation module 314 comprises specialized hardware and software for controlling all functions related to generating all code and machine learning feedback for generating self-learning software code for executing future processes associated with executing the data and memory reorganization and storage method of the algorithm of FIG. 2. Communication controllers 302 are enabled for controlling all communications between sensor interface module 304, detection module 310, analysis and modification module 308, and code generation module 314.

Figure 4:
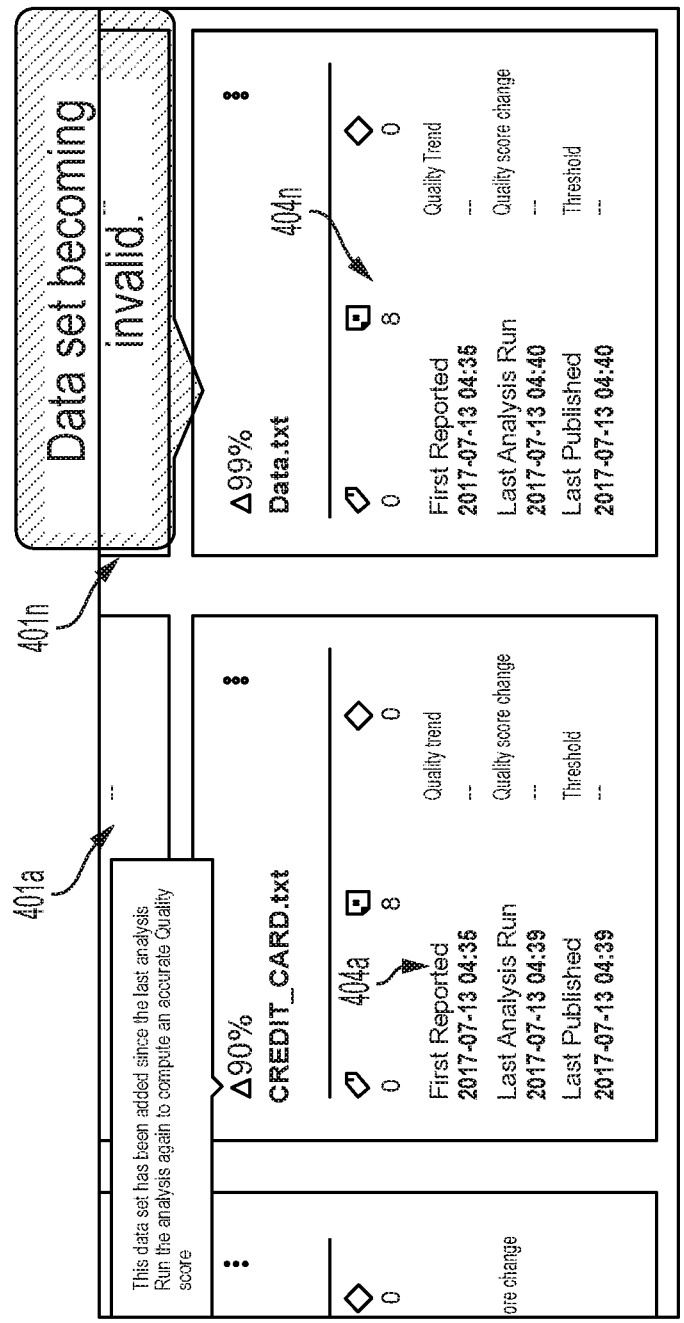
FIG. 4 illustrates an implementation example enabled by the system of FIG. 1 for executing multiple software runs associated with improving memory storage technology, in accordance with embodiments of the present invention.

FIG. 4 illustrates an implementation example enabled by system 100 of FIG. 1 for executing multiple software runs 401a . . . 401n associated with improving memory storage technology, in accordance with embodiments of the present invention. For example, with respect to a data analysis process, an organization executes a data profiling task 404a (with respect to input processes) that takes 10 hours to complete. Subsequently (after a specified time period), additional data is appended data of the data profiling task 404a or a portion of data becomes outdated and therefore the data profiling task 404a is executed again. Based on the result of all previous executions, a software cognitive engine is modified to increase an efficiency of a data analysis process for executing another data profiling task 404n. Therefore system 100 of FIG. 1 enables an intelligent data analysis process such that a data analysis software tool learns and retrains (i.e., modifies) from previous executions and optimizes software code for current and subsequent executions.

Typical limitations of current data analysis tools include enabling a process for running data analysis with respect to an entire volume of data for every run thereby being associated with an inability to discriminate between the various data structures for analysis. Therefore, system 100 enables intelligent data analysis engine for executing an improved data analysis process with respect to specified data. The intelligent data analysis engine is configured to increase analysis efficiency based on actual data or information retrieved via previous runs. For example, if a data structure did not change after a past run, most of the data analysis algorithms executed may be skipped during future runs. The following process is associated with modifying code for increasing an efficiency of an intelligent data analysis engine:

During execution of an intelligent data analysis engine, it may be determined that unchanged data columns (for analysis) have been detected and therefore most of the data analysis algorithms executed may be skipped during future runs. Likewise, if data becomes outdated due to a change in configuration, (e.g., missing values) then a missing value algorithm may be run and a result may be aggregated to increase overall data quality. During the aforementioned process, if delta of modified data is determined to be less than a specified threshold, then most of the implemented data analysis algorithms may be skipped during future runs. Likewise, if a delta of modified data is greater than a specified threshold, analysis code is executed with respect to the delta and if it is determined that delta data fall within outliers or is associated with a same classification as an original column of data then most of the implemented data analysis algorithms may be skipped during future runs. If the system detects (during a first run of the data analysis algorithms) that after N rows, the data comprises similar traits, the data analysis algorithms may be configured to run with respect to a data sample instead of an entire data set. Likewise, a criticality of a particular column of data is calculated such that a full analysis of the entire data set is executed.

Figure 5:
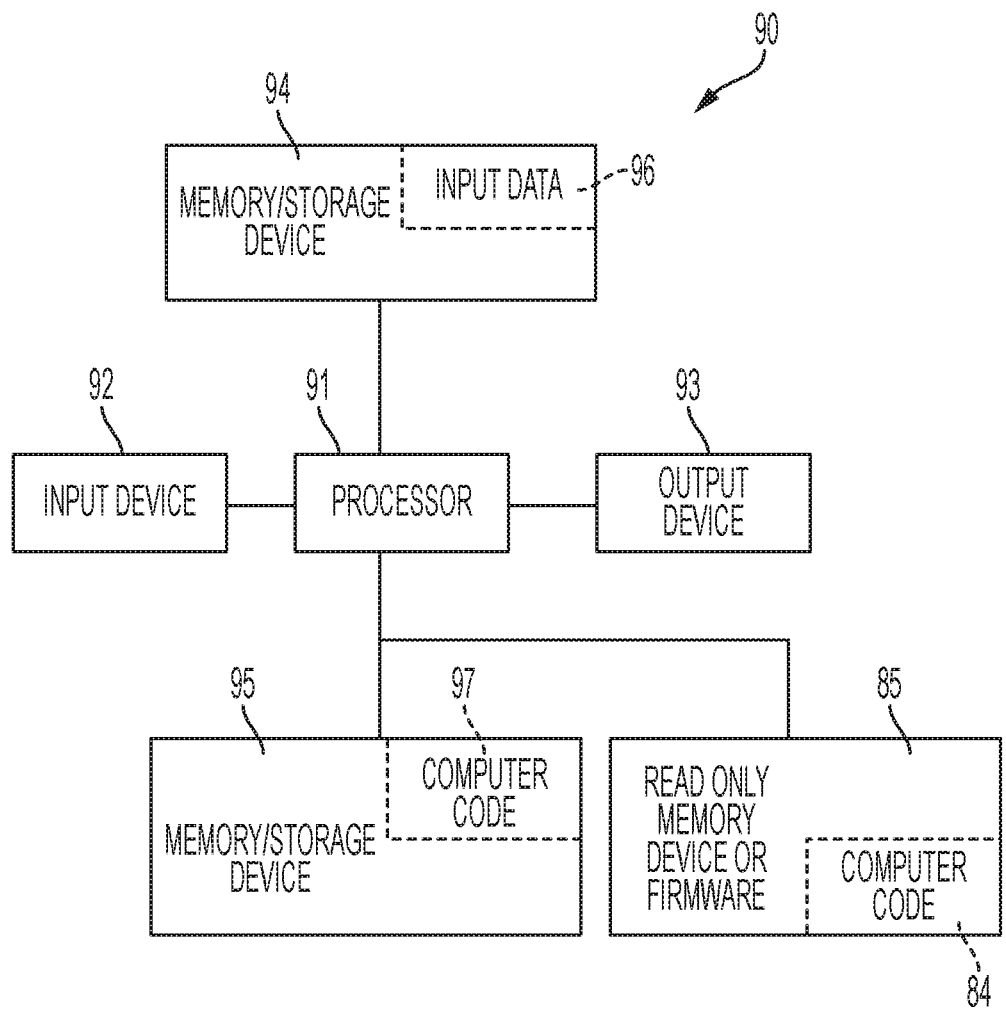
FIG. 5 illustrates a computer system used by the system of FIG. 1 for improving memory storage technology associated with selecting and executing specialized computer code for modifying data and memory storage within a modified portion of memory, in accordance with embodiments of the present invention.

FIG. 5 illustrates a computer system 90 (e.g., database hardware controller 14, database systems 25, and remote data source systems 27 of FIG. 1) used by or comprised by the system of FIG. 1 for improving memory storage technology associated with selecting and executing specialized computer code for modifying data and memory storage within a modified portion of memory, in accordance with embodiments of the present invention.

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, spark, R language, or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. 5 includes a processor 91, an input device 92 coupled to the processor 91, an output device 93 coupled to the processor 91, and memory devices 94 and 95 each coupled to the processor 91. The input device 92 may be, inter alia, a keyboard, a mouse, a camera, a touchscreen, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithm of FIG. 2) for improving memory storage technology associated with selecting and executing specialized computer code for modifying data and memory storage within a modified portion of memory. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices Such as read only memory device 96) may include algorithms (e.g., the algorithm of FIG. 2) and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including algorithms) may be stored on a static, nonremovable, read-only storage medium such as a Read-Only Memory (ROM) device 85, or may be accessed by processor 91 directly from such a static, nonremovable, read-only medium 85. Similarly, in some embodiments, stored computer program code 97 may be stored as computer-readable firmware 85, or may be accessed by processor 91 directly from such firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to improve memory storage technology associated with selecting and executing specialized computer code for modifying data and memory storage within a modified portion of memory. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for enabling a process for improving memory storage technology associated with selecting and executing specialized computer code for modifying data and memory storage within a modified portion of memory. In another embodiment, the invention provides a business method that performs the process steps of the invention on a subscription, advertising, and/or fee basis. That is, a service supplier, such as a Solution Integrator, could offer to enable a process for improving memory storage technology associated with selecting and executing specialized computer code for modifying data and memory storage within a modified portion of memory. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

Cloud Computing Environment

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
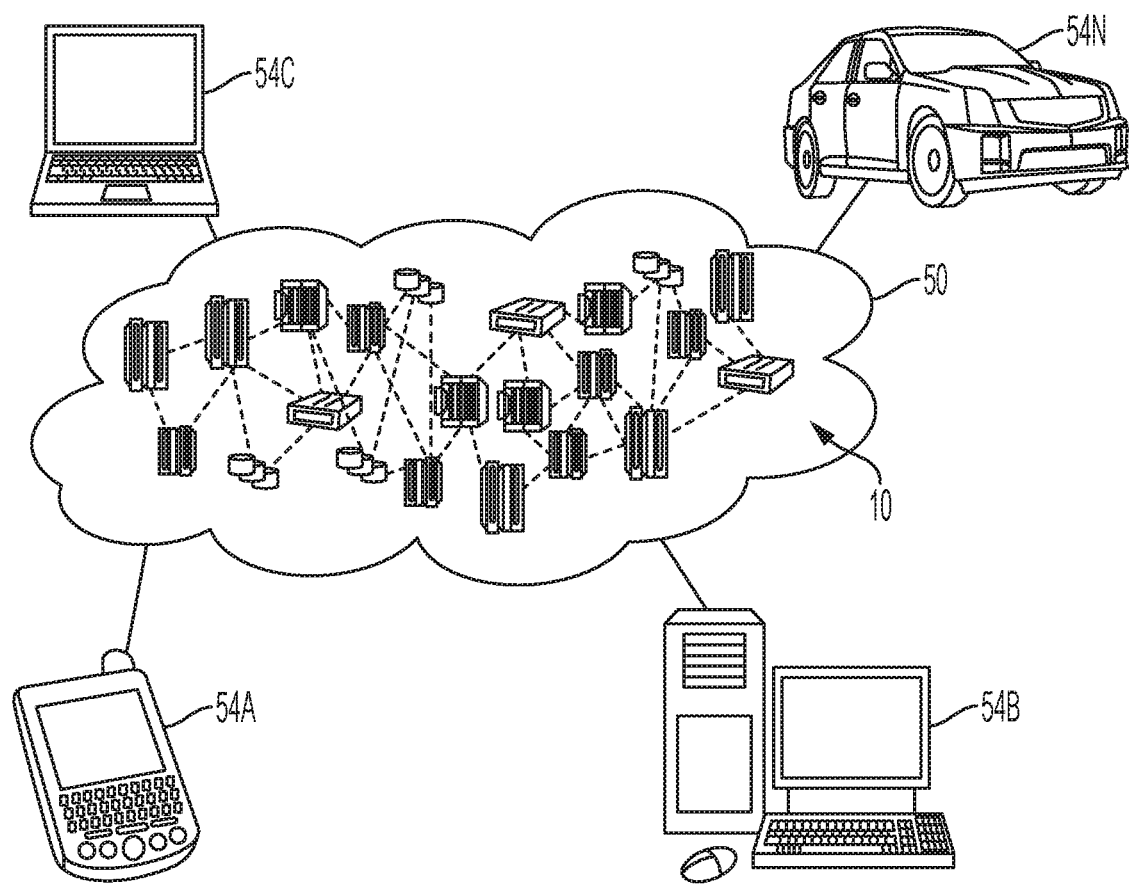
FIG. 6 illustrates a cloud computing environment, in accordance with embodiments of the present invention.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A, 54B, 54C and 54N shown in FIG. 6 are intended to be illustrative only and that computing nodes 10 and cloud computing environment 50 can communicate with any type of computerized device over any type of network and/or network addressable connection (e.g., using a web browser).

Figure 7:
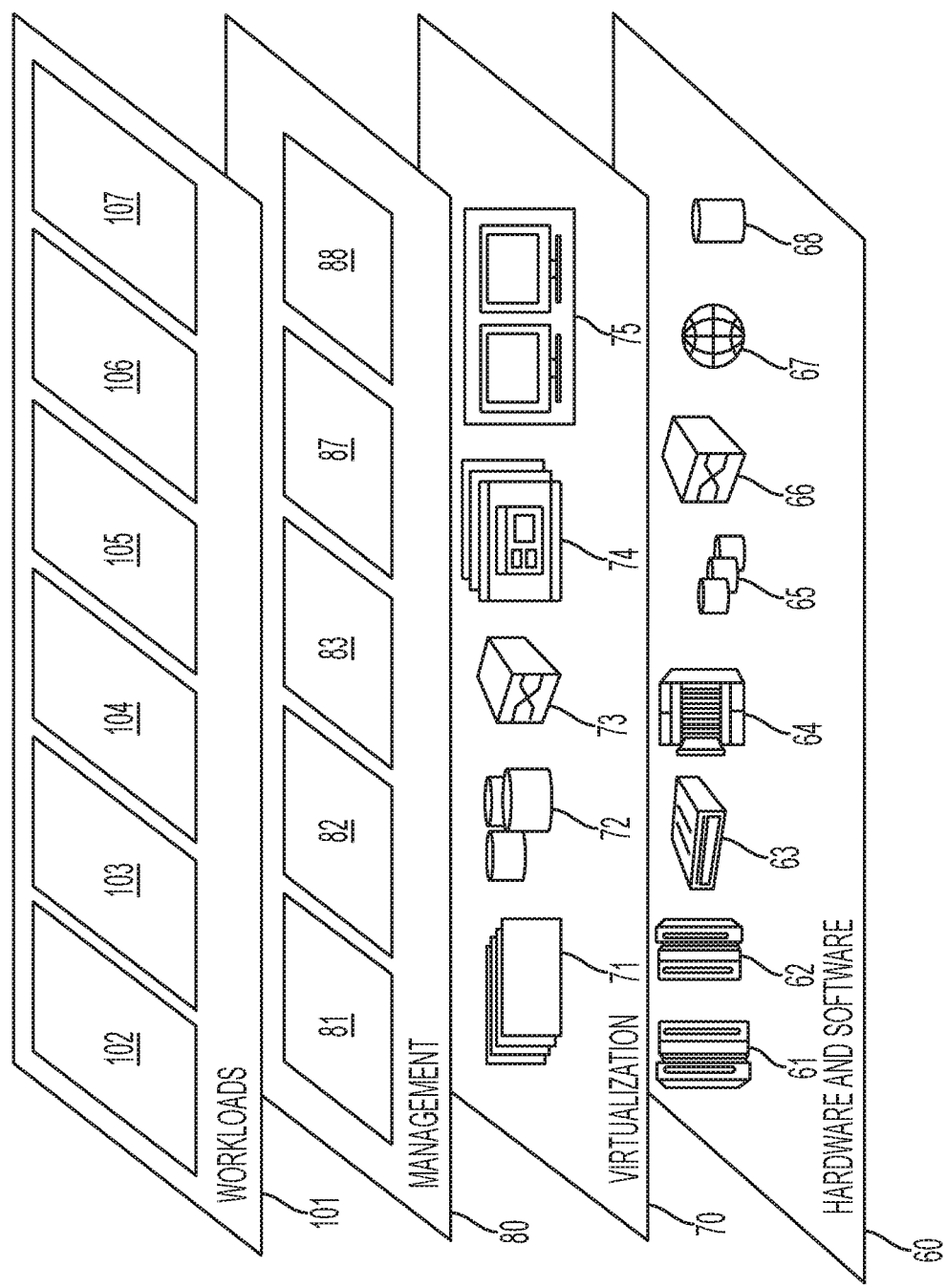
FIG. 7 illustrates a set of functional abstraction layers provided by cloud computing environment, in accordance with embodiments of the present invention.

Referring now to FIG. 7, a set of functional abstraction layers provided by cloud computing environment 50 (see FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 101 provides examples of functionality for which the cloud computing environment may be utilized. Examples of workloads and functions which may be provided from this layer include: mapping and navigation 102; software development and lifecycle management 103; virtual classroom education delivery 104; data analytics processing 105; transaction processing 106; and for improving memory storage technology associated with selecting and executing specialized computer code for modifying data and memory storage within a modified portion of memory 108.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A data and memory reorganization and storage method comprising:
  configuring, by a processor of a database hardware controller executing an analysis software tool, data capture and analysis settings of a database system resulting in configured data capture and analysis settings;
  receiving from a remotely located data source, by said processor in accordance with said configured data capture settings, a data and associated memory analysis request;
  first applying, by said processor, first hardware and software tests to received data assets to select a data asset for executing a specified type of analysis to execute said data and associated memory analysis request;
  second applying, by said processor, second hardware and software tests to said received data assets to determine a relevance of said received data assets for defining an order for executing a specified type of analysis with respect to data, of said received data assets, being stored within a specialized memory structure;
  selecting, by said processor in response to said second applying, specified test code for executing said specified type of analysis with respect to said data being stored within said specialized memory structure;
  selecting, by said processor, a specified portion of said data and a specified portion of said memory;
  executing, by said processor, said specified test code resulting in executing said specified type of analysis with respect to said specified portion of said data and said specified portion of said memory, wherein said executing said specified type of analysis comprises;
  analyzing, by said processor, a number of access attempts for said specified portion of said data with respect to a function of assigned terms; and
  generating, by said processor based on results of said analyzing, a predictive model configured to predict a future number of data access attempts with respect to a function of said assigned terms associated with said specified portion of said data;
  modifying, by said processor in response to executing said specified test code, said specified portion of said data and said specified portion of said memory resulting in a modified portion of said data and a modified portion of said memory, wherein said modifying comprises removing a portion of said specified test code associated with said specified type of analysis resulting in said modified portion of said data and said modified portion of said memory; and
  storing, by said processor, said modified portion of said data within said modified portion of said memory;
  executing, by said processor for each data asset of said data assets, said predictive model thereby predicting a number of data access attempts with respect to a ranking for each said data asset;
  executing, by said processor, said ranking thereby controlling an order at which said received data assets are deep analyzed;
  enabling, by said processor, an intelligent analysis process such that said analysis software tool learns and retrains internal software code from previous executions of said data and memory reorganization and storage method;
  optimizing, by said processor in response to said enabling, said internal software code with respect to skipping specified portions of said internal software code being executed during subsequent executions of said internal software code thereby increasing a speed of analysis during operation of said database hardware controller, said remotely located data source, and said specialized memory structure; and
  enabling, by said processor in response to results of said optimizing, on-demand network access of said database hardware controller, said remotely located data source, and said specialized memory structure to a shared pool of configurable computing resources executing said internal software code.

2. The method of claim 1, further comprising:
  determining, by said processor in response to said executing said specified test code, relevance attributes associated with said specified portion of said data and said specified portion of said memory.

3. The method of claim 2, further comprising:
  defining, by said processor in response to said execution of said specified type of analysis, an order for executing said specified type of analysis based on said relevance attributes.

4. The method of claim 1, further comprising:
  determining, by said processor in response to said executing said specified test code, changes associated with said specified portion of said data and said specified portion of said memory with respect to previous analysis processes of said specified portion of said data and said specified portion of said memory.

5. The method of claim 4, further comprising:
  modifying, by said processor in response to said changes, said specified type of analysis resulting in a modified analysis; and executing, by said processor, said modified analysis resulting in a desired result with respect to said specified portion of data and said specified portion of memory.

6. The method of claim 5, wherein said modifying said specified type of analysis comprises removing portions of code associated with steps of said specified type of analysis.

7. The method of claim 1, further comprising:
detecting, by said processor in response to said executing said specified test code, a domain associated with said specified portion of said data and said specified portion of said memory with respect to relevance attributes of said data and associated memory analysis request.

8. The method of claim 7, further comprising:
modifying, by said processor based on said relevance attributes, said specified type of analysis.

9. The method of claim 8, wherein said modifying said specified type of analysis comprises removing portions of code associated with steps of said specified type of analysis.

10. The method of claim 1, further comprising:
generating, by said processor, self learning software code for executing future processes associated with executing said data and memory reorganization and storage method.

11. The method of claim 1, wherein said configuring said data capture and analysis settings comprises:
defining specified hardware and software sources for said executing said specified analysis code.

12. The method of claim 1, further comprising:
analyzing, by said processor, usage associated with a relevance of said specified portion of said data and said specified portion of said memory.

13. The method of claim 1, further comprising: providing at least one support service for at least one of creating, integrating, hosting, maintaining, and deploying non-transitory computer-readable code in the control hardware, said code being executed by the computer processor to implement: said configuring, said receiving, said selecting said specified analysis code, said executing said specified test code, said selecting said specified portion of data, said executing said specified analysis code, said modifying, and said storing.

14. A computer program product, comprising a computer readable storage medium storing a computer readable program code, said computer readable program code comprising an algorithm that when executed by a processor of a database hardware controller implements a data and memory reorganization and storage method, said method comprising:
configuring, by said processor executing an analysis software tool, data capture and analysis settings of a database system resulting in configured data capture and analysis settings;
receiving from a remotely located data source, by said processor in accordance with said configured data capture settings, a data and associated memory analysis request;
first applying, by said processor, first hardware and software tests to received data assets to select a data asset for executing a specified type of analysis to execute said data and associated memory analysis request;
second applying, by said processor, second hardware and software tests to said received data assets to determine a relevance of said received data assets for defining an order for executing a specified type of analysis with respect to data, of said received data assets, being stored within a specialized memory structure;
selecting, by said processor in response to said second applying, specified test code for executing said specified type of analysis with respect to said data being stored within said specialized memory structure;
selecting, by said processor, a specified portion of said data and a specified portion of said memory;
executing, by said processor, said specified test code resulting in executing said specified type of analysis with respect to said specified portion of said data and said specified portion of said memory, wherein said executing said specified type of analysis comprises;
analyzing, by said processor, a number of access attempts for said specified portion of said data with respect to a function of assigned terms; and
generating, by said processor based on results of said analyzing, a predictive model configured to predict a future number of data access attempts with respect to a function of said assigned terms associated with said specified portion of said data;
modifying, by said processor in response to executing said specified test code, said specified portion of said data and said specified portion of said memory resulting in a modified portion of said data and a modified portion of said memory, wherein said modifying comprises removing a portion of said specified test code associated with said specified type of analysis resulting in said modified portion of said data and said modified portion of said memory;
storing, by said processor, said modified portion of said data within said modified portion of said memory;
executing, by said processor for each data asset of said data assets, said predictive model thereby predicting a number of data access attempts with respect to a ranking for each said data asset;
executing, by said processor, said ranking thereby controlling an order at which said received data assets are deep analyzed;
enabling, by said processor, an intelligent analysis process such that said analysis software tool learns and retrains internal software code from previous executions of said data and memory reorganization and storage method;
optimizing, by said processor in response to said enabling, said internal software code with respect to skipping specified portions of said internal software code being executed during subsequent executions of said internal software code thereby increasing a speed of analysis during operation of said database hardware controller, said remotely located data source, and said specialized memory structure; and
enabling, by said processor in response to results of said optimizing, on-demand network access of said database hardware controller, said remotely located data source, and said specialized memory structure to a shared pool of configurable computing resources executing said internal software code.

15. The computer program product of claim 14, wherein said method further comprises:
determining, by said processor in response to said executing said specified test code, relevance attributes associated with said specified portion of said data and said specified portion of said memory.

16. The computer program product of claim 15, wherein said method further comprises:
defining, by said processor in response to said execution of said specified type of analysis, an order for executing said specified type of analysis based on said relevance attributes.

17. The computer program product of claim 14, wherein said method further comprises:
   determining, by said processor in response to said executing said specified test code, changes associated with said specified portion of said data and said specified portion of said memory with respect to previous analysis processes of said specified portion of said data and said specified portion of said memory.

18. The computer program product of claim 17, wherein said method further comprises:
   modifying, by said processor in response to said changes, said specified type of analysis resulting in a modified analysis; and
   executing, by said processor, said modified analysis resulting in a desired result with respect to said specified portion of data and said specified portion of memory.

19. The computer program product of claim 18, wherein said modifying said specified type of analysis comprises removing portions of code associated with steps of said specified type of analysis.

20. A database hardware controller comprising a processor coupled to a non-transitory computer-readable memory unit, said memory unit comprising instructions that when executed by the computer processor implements a data and memory reorganization and storage method comprising:
   configuring, by said processor executing an analysis software tool, data capture and analysis settings of a database system resulting in configured data capture and analysis settings;
   receiving from a remotely located data source, by said processor in accordance with said configured data capture settings, a data and associated memory analysis request;
   first applying, by said processor, first hardware and software tests to received data assets to select a data asset for executing a specified type of analysis to execute said data and associated memory analysis request;
   second applying, by said processor, second hardware and software tests to said received data assets to determine a relevance of said received data assets for defining an order for executing a specified type of analysis with respect to data, of said received data assets, being stored within a specialized memory structure;
   selecting, by said processor in response to said second applying, specified test code for executing said specified type of analysis with respect to said data being stored within said specialized memory structure;
   selecting, by said processor, a specified portion of said data and a specified portion of said memory;
   executing, by said processor, said specified test code resulting in executing said specified type of analysis with respect to said specified portion of said data and said specified portion of said memory, wherein said executing said specified type of analysis comprises;
   analyzing, by said processor, a number of access attempts for said specified portion of said data with respect to a function of assigned terms; and
   generating, by said processor based on results of said analyzing, a predictive model configured to predict a future number of data access attempts with respect to a function of said assigned terms associated with said specified portion of said data;
   modifying, by said processor in response to executing said specified test code, said specified portion of said data and said specified portion of said memory resulting in a modified portion of said data and a modified portion of said memory, wherein said modifying comprises removing a portion of said specified test code associated with said specified type of analysis resulting in said modified portion of said data and said modified portion of said memory;
   storing, by said processor, said modified portion of said data within said modified portion of said memory;
   executing, by said processor for each data asset of said data assets, said predictive model thereby predicting a number of data access attempts with respect to a ranking for each said data asset;
   executing, by said processor, said ranking thereby controlling an order at which said received data assets are deep analyzed;
   enabling, by said processor, an intelligent analysis process such that said analysis software tool learns and retrains internal software code from previous executions of said data and memory reorganization and storage method;
   optimizing, by said processor in response to said enabling, said internal software code with respect to skipping specified portions of said internal software code being executed during subsequent executions of said internal software code thereby increasing a speed of analysis during operation of said database hardware controller, said remotely located data source, and said specialized memory structure; and
   enabling, by said processor in response to results of said optimizing, on-demand network access of said database hardware controller, said remotely located data source, and said specialized memory structure to a shared pool of configurable computing resources executing said internal software code.

* * * * *